(12) United States Patent
Barink et al.

(10) Patent No.: US 7,535,360 B2
(45) Date of Patent: *May 19, 2009

(54) HOMODYNE RFID RECEIVER AND METHOD

(75) Inventors: Bernard Barink, McKinney, TX (US); Loek J. d'Hont, Rotonda-West, FL (US)

(73) Assignee: Sirit Technologies Inc., Toronto, Ontario (CA)

( * ) Notice: Subject to any disclaimer, the term of this patent is extended or adjusted under 35 U.S.C. 154(b) by 6 days.

This patent is subject to a terminal disclaimer.

(21) Appl. No.: 11/739,584

(22) Filed: Apr. 24, 2007

(65) Prior Publication Data

US 2007/0247314 A1   Oct. 25, 2007

Related U.S. Application Data

(63) Continuation of application No. 10/993,316, filed on Nov. 19, 2004, now Pat. No. 7,209,040.

(51) Int. Cl.
*G08B 13/14* (2006.01)
(52) U.S. Cl. .................. 340/572.2; 340/10.1; 342/42
(58) Field of Classification Search .......... 340/572.2, 340/10.1, 10.3, 10.4; 342/42, 44
See application file for complete search history.

(56) References Cited

U.S. PATENT DOCUMENTS

| | | | |
|---|---|---|---|
| 4,360,810 A | 11/1982 | Landt | |
| 4,739,328 A | 4/1988 | Koelle et al. | |
| 4,786,907 A | 11/1988 | Koelle | |
| 4,888,591 A | 12/1989 | Landt et al. | |
| 5,030,807 A | 7/1991 | Landt et al. | |
| 5,055,659 A | 10/1991 | Hendrick et al. | |
| 5,101,347 A | 3/1992 | Balakrishnan et al. | |
| 5,485,520 A | 1/1996 | Chaum et al. | |
| 5,784,686 A | 7/1998 | Wu et al. | |
| 5,974,088 A | 10/1999 | Chang | |
| 6,091,343 A | 7/2000 | Dykema et al. | |
| 6,531,957 B1 | 3/2003 | Nysen | |
| 6,611,224 B1 | 8/2003 | Nysen et al. | |
| 6,639,509 B1 | 10/2003 | Martinez | |
| 6,686,830 B1 | 2/2004 | Schirtzer | |
| 6,943,680 B2 | 9/2005 | Ward | |
| 7,209,040 B2 * | 4/2007 | Barink et al. | ............ 340/572.2 |

OTHER PUBLICATIONS

International Search Report and Written Opinion of the International Searching Authority issued in International Application No. PCT/US2005/040554 on Mar. 15, 2006; 10 pages.
International Preliminary Report on Patentability under Chapter issued in International Application No. PCT/US2005/040554 on May 31, 2007; 7 pages.

* cited by examiner

*Primary Examiner*—John A Tweel, Jr.
(74) *Attorney, Agent, or Firm*—Fish & Richardson P.C.

(57) ABSTRACT

An RFID circuit comprises an RF carrier signal source, a hybrid coupled to the RF carrier signal source operable to generate an in-phase and a quadrature phase component of the RF carrier signal, a switch coupled to the hybrid operable to pass one of the in-phase and quadrature phase components of the RF carrier signal to its output, and a mixer coupled to the output of the switch operable to multiply one of the in-phase and quadrature phase component of the carrier signal and a received modulated carrier signal and generate a baseband signal.

18 Claims, 2 Drawing Sheets

… (1) …

HOMODYNE RFID RECEIVER AND METHOD

CLAIM OF PRIORITY

This application claims priority under 35 USC §119(e) and is a continuation of U.S. patent application Ser. No. 10/993,316, filed on Nov. 19, 2004, now known as U.S. Pat No. 7,209,040, issued Apr. 24, 2007, the entire contents of which are hereby incorporated by reference.

TECHNICAL FIELD

This invention relates to radio frequency identification technology, and more particularly to Homodyne RFID Receiver and Method.

BACKGROUND

RFID or radio frequency identification technology has been used in a variety of commercial applications such as inventory tracking and highway toll tags. In general, a transceiver tag or transponder transmits stored data by backscattering varying amounts of an electromagnetic field generated by an RFID reader. The RFID tag may be a passive device that derives its electrical energy from the received electromagnetic field or may be an active device that incorporates its own power source. The backscattered energy is then read by the RFID reader and the data is extracted therefrom.

Several technical hurdles must be overcome in order to make RFID work. Typically, the backscattered energy from the RFID tag contains relatively low power and has a short range. There is also a tendency for the transmitted signal to leak into the received signal path in the reader, thus introducing noise. Neither the distance between the RFID tag and reader nor the phase relationship between the backscattered signal and the local oscillator in the reader is known. The RFID system must also function where the RFID tag has a non-zero rate of displacement and/or acceleration toward or away from the RFID reader. In toll road applications, for example, it is desirable to permit a RFID tag a speed of at least 100 mph.

Because the RFID reader's local oscillator frequency is identical to that of the carrier frequency, the receiver is a homodyne detector. In a homodyne receiver, more than a single detected channel is required to detect the backscattered signal's amplitude modulation envelope because signal nulls may be present depending on the signal phase relative to the phase of the local oscillator. These signal nulls have traditionally been overcome by using a second detector or mixer that is at a 90 degree phase shift from the first local oscillator. The output of the two mixers are usually combined in an image-reject configuration, or alternatively, by processing the signals in the digital domain. However, both solutions have proven to be undesirable.

DESCRIPTION OF DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
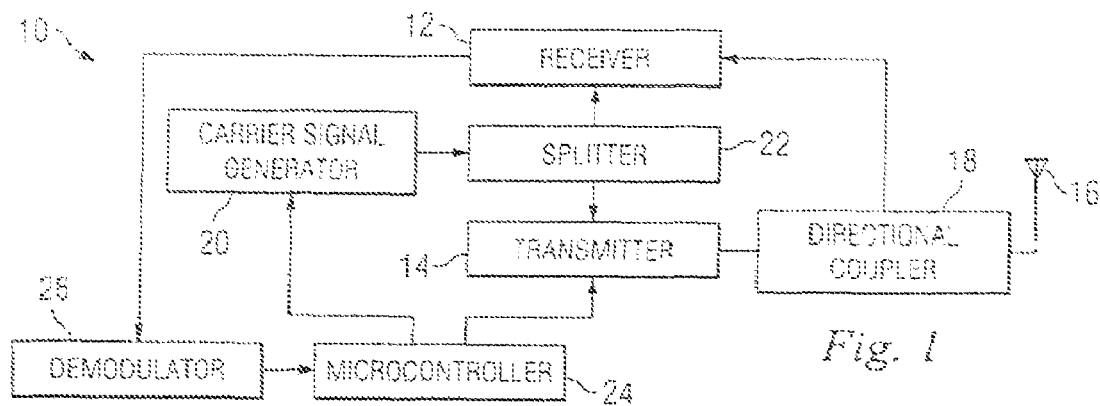
FIG. 1 is a simplifed schematic diagram of an embodiment of a transceiver having a single mixer homodyne receiver and method therefor.

FIG. 1 is a simplified schematic diagram of an embodiment of an RFID transceiver 10. Although transceiver 10 is described below in the context of an RFID, it may be adapted for use in non-RFID applications. Transceiver 10 comprises a receiver 12 that uses three mixers or multipliers, as described in more detail below. Transceiver 10 also comprises a transmitter 14 coupled to an antenna 16 via a directional coupler 18. Transceiver 10 may alternately employ two antennas, one for receiver 12 and one for transmitter 14. A carrier signal generator 20 is coupled to both receiver 12 and transmitter 14 via a signal splitter 22. A microprocessor or microcontroller 24 is coupled to transmitter 14 and carrier signal generator 20. A demodulator 26 such as an amplitude shift keying (ASK) demodulator or data slicer is coupled to receiver 12 and microprocessor 24. The data slicer may be followed by an optional subcarrier demodulator depending on the RFID protocol used.

In operation, carrier signal generator 20 generates a radio frequency carrier signal that is combined with an information signal generated by the microcontroller 24. In particular, the transmission signal output from transmitter 14 includes the carrier signal modulated by the information signal. The transmission signal is radiated by antenna 16 to a transponder or RFID tag (not shown) located in proximity of transceiver 12. The RFID tag may be stationary or moving relative to the transceiver 12. The signal radiated back from the RFID tag in response to the transmitted signal is captured by antenna 16 and delivered to receiver 12. Receiver 12, having two mixers, is operable to mix the received signal with both the in-phase (I) and quadrature or 90° out-of-phase (Q) phase components of the locally-generated carrier signal to avoid signal nulls. The two resultant baseband signals may be further demodulated by FSK demodulator 26 and the data extracted by microcontroller 24. A decision circuit based on precise RSSI information for both of the IF channels decides which of the IF channels is valid for further processing by the digital controller. Details of receiver 12 and operations thereof are described below with reference to FIGS. 14 below.

Figure 2:
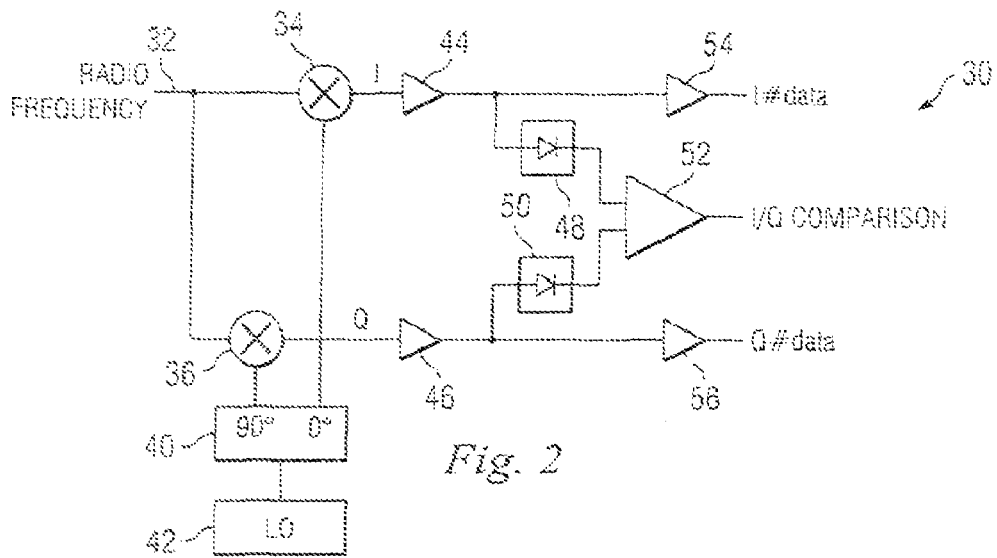
FIG. 2 is a more detailed circuit diagram of an embodiment of a transceiver with a single mixer homodyne receiver and method therefor.

FIG. 2 is a more detailed circuit diagram of an embodiment of an analog portion 30 of receiver 12. The analog portion of receiver 12 receives an RF signal 32 as input. RF signal 32 is a backscattered signal generated by the RFID tag in response to a query signal transmitted by the transmitter portion of transceiver 10. The received RF signal is delivered to two mixers 34 and 36, which respectively multiplies RF signal 32 with two signal phase-shifted signals of the carrier signal generated by components such as a hybrid (or phase shifter) 40 and a local oscillator (LO) 42. Local oscillator 42 may be a voltage-controlled oscillator or another suitable component. Mixer 34 receives and mixes the received RF signal and the local carrier signal with no phase-shift; and mixer 36 receives and mixes the received RF signal and the local carrier signal with a 90 degree phase-shift. The output of mixer 34 is the in-phase (I) phase component and the output of mixer 36 is the quadrature (Q) phase component. The phase of both the in-phase and quadrature signals do not vary with the phase shift between the RF signal and the local oscillator signal. However, the amplitude of the in-phase and quadrature signals are dependent on the phase shift. If the phase difference between the RF signal and the local oscillator signal is Φ, then the in-phase signal amplitude is proportional with (cosine Φ), and the quadrature signal amplitude is proportional with (sine Φ). Therefore, at least one of the two in-phase or quadrature signals has an amplitude of at least the maximum obtainable amplitude divided by the square root of 2 (or $\sqrt{2}$). The phase shift of the signals is either 0° or 180°.

The in-phase and quadrature signals from the mixers are amplified the 44 and 46, respectively. The output of amplifiers 44 and 46 are coupled to blocks 48 and 50, respectively, which are operable to determine the amplitude levels of the in-phase and quadrature signals. The output of blocks 48 and 50 are coupled to the inputs of a comparator 52, which is operable to determine which signal has the larger amplitude level. The output of comparator 52, is labeled "I/Q COMPARISON" for ease of identification and indicates whether one signal is larger than the other. For example, if the in-phase signal is larger than the quadrature signal, then I/Q COMPARISON output is high, and if the quadrature signal is larger than the in-phase signal, the I/Q COMPARISON output is low. The output of amplifiers 44 and 46 are also coupled to data slicers 54 and 56, respectively. Data slicers 54 and 56 compare the amplified mixer outputs to a predetermined analog level and provides a digital logic output indicative of whether the input is greater than or less than the analog level. If the mixer output is greater than the analog level, then the output of the data slicer is a logic one or high; if the mixer output is less than the analog level, then the output of the data slicer is a logic zero or low. The output from data slicers 54 and 56 are labeled "I DATA" and "Q DATA", respectively for ease of reference. The I DATA and Q DATA signals are digital level signals that have no phase shift except for either a 0° or a 180° phase shift, and at least one of the signals is a valid non-null signal.

Note that the received RF signal from the RFID tag may be processed by one or more filters (bandpass, low-pass, and/or high-pass filters), limiters, amplifiers and other suitable components to remove unwanted noise, strengthen and otherwise condition the signal. These components are not specifically shown in FIG. 2 in order to better focus attention on the key portions of the circuit.

Figure 3:
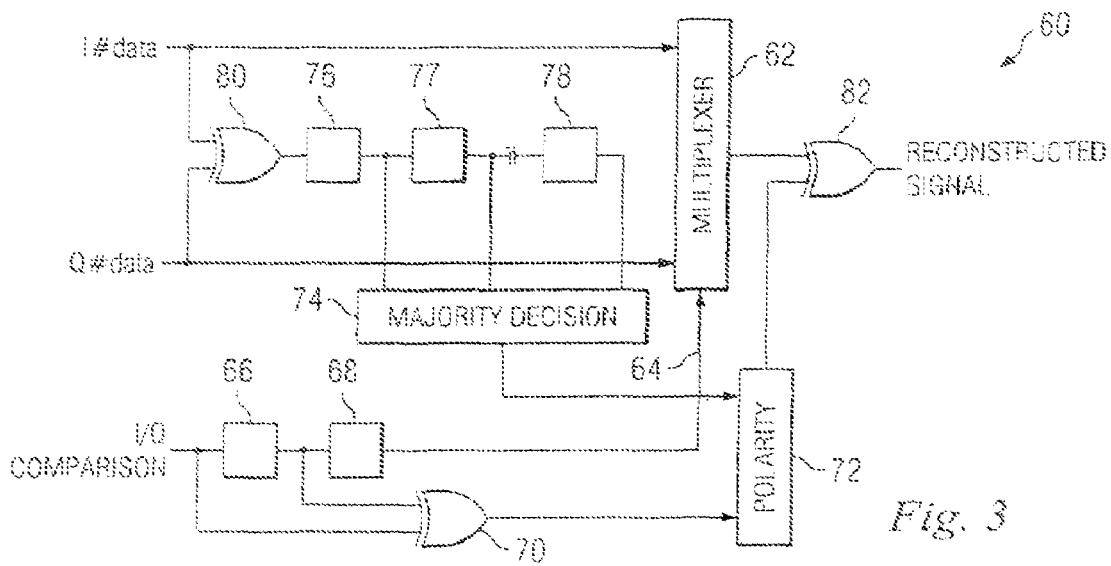
FIG. 3 is a more detailed circuit diagram of another embodiment of a transceiver with single mixer homodyne receiver and method therefor.

FIG. 3 is a more detailed functional block diagram of an embodiment of a digital portion 60 of receiver 12. Digital portion 60 is operable to reconstruct a demodulated signal by selecting one of the I DATA or Q DATA signals as the demodulated signal. The I DATA and Q DATA signals are provided to a multiplexer 62 that is operable to select one of the two signals present at its input depending on the state of a control signal 64. The control signal is determined by a circuit receiving the I/Q COMPARISON signal from the analog portion of the circuit. The I/Q COMPARISON signal is received by a first delay block 66 and a second delay block 68 coupled serially. Second delay block 68 is used to ensure substantially simultaneous updates of multiplexer 62 and polarity switch 72. An XOR gate 70 is coupled to the outputs of the two delay blocks to generate a signal indicative of the moment when the signal having the larger amplitude switches from the in-phase signal to the quadrature signal, or vice versa, due to RFID tag displacement. This moment is when the output polarity is updated in response to the phase comparison of I DATA and Q DATA. Since I DATA and Q DATA are both valid during or close to an amplitude transition, a polarity comparison would help to determine whether the current polarity should be inverted when multiplexer 62 switches the output from one input to the other. Polarity switch 72 retains information on whether the current polarity should be inverted. This information is updated dependent on the change in the I/Q COMPARISON signal from XOR gate 70 and on the result of a comparison between the I DATA and Q DATA polarity from a majority decision block 74. Therefore, whenever the selection of I DATA or Q DATA switches from one to the other at multiplexer 62, a determination is made as to whether the two signals have the same or opposite polarity by majority decision block 74. If the polarity is opposite, then polarity switch 72 flips the polarity substantially simultaneously with the selection switch over at multiplexer 62. The selection switch over and the polarity switching occur substantially simultaneously to avoid glitches in the reconstructed output signal.

The input to polarity switch 72 are the output of XOR gate 70 and majority decision block 74. Majority decision block 74 is coupled to delay blocks 76 78, which are coupled to the output of another XOR gate 80. XOR gate 80 receives I DATA and Q DATA and determines whether these two signals have the same or opposite polarity. Delay blocks 76 78 and majority decision block 74 makes a correct determination even if there is a certain timing delay between I DATA and Q DATA up to half of the delay time in the delay blocks.

An XOR gate 82 is coupled to multiplexer 62 and polarity switch 72 and generates a reconstructed signal at its output. The polarity of the reconstructed signal is flipped or not flipped by XOR gate 82 to prevent a 180° phase shift in a data transmission. The reconstructed signal is the demodulated digital level signal with a constant phase shift regardless of the location of the RFID tag or whether it has a non-zero displacement. Since it is unknown what the polarity setting of polarity switch 72 is when there is no valid I DATA or Q DATA signal present, the polarity of the signal during a datagram transmission is not known. Further data encoding and/or datagram formatting allows for a polarity insensitive decoding. Examples of data encoding includes FM0, FM1, NRZ (non-return to zero), NRZI (non-return to zero inverted) encoding formats; an example of a sub-carrier modulation is frequency-shift keying (FSK) modulation; and an example of datagram formatting uses particular fixed and known run-in patterns. Although the polarity of data in a datagram as output by this circuit is unknown, the polarity does not change within a datagram.

In implementation, the functional blocks of digital circuit 60 of the receiver may be combined into one logic component and may be implemented by a programmable logic device or filed programmable gate array, for example. Alternatively, the functions carried out by the digital portion of the receiver may be implemented in computer software and executed in microcontroller 24 (FIG. 1) or another processor as long as the processing speed is sufficiently fast to reconstruct a valid signal given the data rate, data encoding and sub-carrier modulation.

Figure 4:
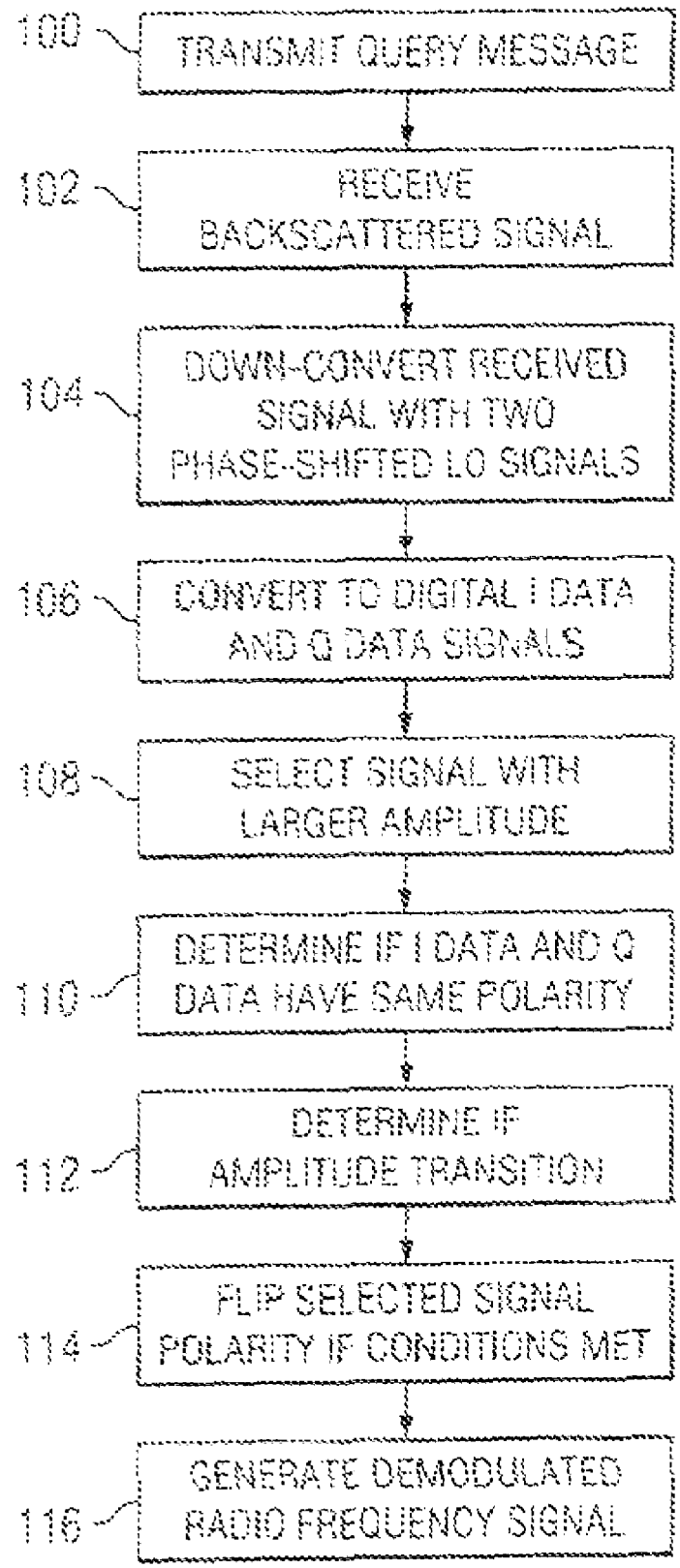
FIG. 4 is a simplified flowchart of an embodiment of a method for an RFID transceiver.

FIG. 4 is a simplified flowchart of an embodiment of a method for an RFID transceiver that communicates with an RFID tag or transponder. The RFID tag is typically located at an uniknown distance to the Transceiver and may be traveling at an uniknown rate relative to the RFID transceiver. Referring also to FIG. 1, at the beginning of a polling cycle in block 100, a query message is processed by transmitter 14 and transmitted by antenna 16. The query message is the carrier signal or local oscillator signal modulated according to the information signal from microcontroller 24. The carrier signal is generated in carrier signal generator 20. In response to the query message, the RFID tag transmits a reply message and antenna 16 captures the backscattered reply message in block 102. The reply message is directed to receiver 12 for processing. The received signal is properly filtered by one or more filters (not shown) to removed unwanted signals and is down-converted to baseband by using two mixers 34 and 36 (FIG. 2) in block 104. Mixer 34 multiplies the carrier signal generated in carrier signal generator 20 and the received signal; and mixer 36 multiplies a 900 phase-shifted carrier signal and the received signal. The signals from the two mixers are converted to digital signals I DATA and Q DATA in block 106. The I DATA and Q DATA signals are digital level signals that have no phase shift except for a 0°or 180° phase shift, and at least one of them is a valid signal. The resultant I DATA and Q DATA signals may be further processed by filtering and amplification, for example.

The signal that has a larger amplitude is selected in block 108. The amplitude comparison may be made by comparator 52 and the selection may be made by multiplexer 62. In block 110, a determination is made as to whether the I DATA and the Q DATA signals have the same polarity. This determination may be made by XOR gate 80. Another determination is made in block 112 as to whether an amplitude transition is occurring. Amplitude transition occurs when the signal having the larger amplitude is transitioning to the other signal. This determination may be made by delays 66 and 68 and XOR gate 70. If the amplitude transition is determined to have occurred, then the selected signal's polarity is flipped in block 114. This may be accomplished by XOR gate 82 with condition input from polarity switch 72. In block 116, the resultant reconstructed signal is the demodulated RF signal received from the RFID tag.

The system and method described herein is more robust and yet low-cost solution in particular for applications where fast-moving RFID tags and weak tag signals are expected. The system and method described herein does not employ unreliable analog phase-shifting of the baseband signal typically used in image-reject mixer configuration. Unreliable analog decision circuits are also not needed to determine which signal from the mixers are valid.

Although embodiments of the present disclosure have been described in detail, those skilled in the art should understand that various changes, substitutions and alterations may be made without departing from the spirit and scope of the present disclosure. For example, a bandpass filter may be implemented by a low-pass filter and a high-pass filter. Accordingly, all such changes, substitutions and alterations are intended to be included within the scope of the present disclosure as defined in the following claims. In the claims, means- plus-function clauses are intended to cover the structures described herein as performing the recited function and not only structural equivalents, but also equivalent structures.

What is claimed is:

1. An Radio Frequency (RF) device, comprising:
   an RF antenna operable to receive a backscattered signal;
   a signal source operable to generate an in-phase and a quadrature-phase component of an RF carrier signal;
   a first mixer coupled to the signal source and operable to multiply the in-phase component of the RF carrier signal and the received backscattered signal to generate a first baseband signal;
   a second mixer coupled to the signal source and operable to multiply the quadrature-phase component with the received backscattered signal to generate a second baseband signal; and
   a multiplexer operable to pass one of the first baseband signal or the second baseband signal as a demodulated RF output signal based, at least in part, on an amplitude of the first baseband signal or an amplitude of the second baseband signal.

2. The RF device of claim 1, further comprising a polarity switch operable to update a polarity of the demodulated RF output signal based, at least in part, on a polarity of the first baseband signal or a polarity of the second baseband signal.

3. The RF device of claim 2, further comprising logic coupled to the first and second mixers and operable to determine whether the first and second baseband signals have the same polarity, wherein the polarity switch updates the polarity of the demodulated RF output signal based, at least in part, on this determination.

4. The RF device of claim 3, wherein the logic comprises an XOR gate coupled to a delay line and a majority decision block.

5. The RF device of claim 1, further comprising:
   first logic coupled to the first and second mixers and operable to determine which of the first and second baseband signals have a larger amplitude; and
   second logic coupled to the first logic operable to determine when the larger amplitude switches between the first and second baseband signals, wherein the multiplexer passes the one of the first baseband signal or the second baseband signal based, at least in part, on the larger amplitude.

6. The RF device of claim 5, wherein the first logic comprises a comparator operable to compare the amplitudes of the first and second baseband signals.

7. The RF device of claim 5, wherein the second logic comprises a delay line and an XOR gate.

8. The RF device of claim 1, further comprising first and second amplifiers respectively coupled to the first and second mixers and operable to amplify the first and second baseband signals.

9. The RF device of claim 1, further comprising first and second data slicers respectively coupled to the first and second mixers and operable to generate first and second digital baseband signals corresponding to the first and second baseband signals.

10. The RF device of claim 1, further comprising:
    an information signal source;
    a transmitter receiving the RF carrier signal and the information signal and operable to modulate the RF carrier signal according to the information signal, wherein the antenna transmits the modulated RF carrier signal.

11. The RF device of claim 10, further comprising a splitter coupled to the RF carrier signal source and operable to pass the RF carrier signal to a hybrid and the transmitter, wherein the signal sources includes the hybrid.

12. A method comprising:
    generating an in-phase component of a RF carrier signal and a quadrature-phase component of the RF carrier signal;
    receiving a backscattered signal;
    splitting the backscattered signal into a first backscattered component and a second backscattered component;
    multiplying the first backscatter component and the in-phase component of the RF carrier signal to generate a first baseband signal;
    multiplying the second backscatter component and the quadrature-phase component of the RF carrier signal to generate a second baseband signal; and
    passing the first baseband signal or the second baseband signal as a demodulated RF output signal based, at least in part, on an amplitude of the first baseband signal or the second baseband signal.

13. The method of claim 12, further comprising:
    determining whether the first baseband signal and the second baseband signal have a same polarity; and updating a polarity of the demodulated RF output signal based, at least in part, on the determination.

14. The method of claim 13, wherein determining whether the first baseband signal and the second baseband signal have the same polarity comprises:
   obtaining an XOR output of the first and second baseband signals;
   inserting a plurality of delays in the XOR output;
   generating a plurality of variably delayed XOR outputs; and
   generating a majority decision output in response to the plurality of variably delayed XOR outputs.

15. The method of claim 12, further comprising:
   determining whether of the first baseband signal or the second baseband signal has a larger amplitude; and
   determining when the larger amplitude switches between the first baseband signal and the second baseband signal, wherein the first baseband signal or the second baseband signal is passed as the demodulated RF output signal based, at least in part, on the larger amplitude.

16. The method of claim 15, wherein determining which of the first and second baseband signals have a larger amplitude comprises:
   determining an amplitude level of the first baseband signal and the second baseband signal; and
   comparing the amplitude level of the first baseband signal and the amplitude level of the second baseband signal.

17. The method of claim 15, wherein determining when the larger amplitude switches between the first baseband signal and the second baseband signal comprises:
   receiving a determination of which of the first baseband signal or the second baseband signal has a larger amplitude;
   inserting variable delays; and
   generating an XOR output of at least two variably delayed determination of signal with the larger amplitude.

18. The method of claim 9, further comprising amplifying first baseband signal and the second baseband signal.

* * * * *